(12) United States Patent
Hanumanthaiah et al.

(10) Patent No.: US 9,490,804 B2
(45) Date of Patent: Nov. 8, 2016

(54) CAPACITANCE SENSING CIRCUITS, METHODS AND SYSTEMS HAVING CONDUCTIVE TOUCH SURFACE

(75) Inventors: Shruti Hanumanthaiah, Bangalore (IN); Kannan Srinivasagam, Bangalore (IN)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 283 days.

(21) Appl. No.: 13/247,248

(22) Filed: Sep. 28, 2011

(65) Prior Publication Data

US 2013/0076375 A1    Mar. 28, 2013

(51) Int. Cl.
*G01R 27/26* (2006.01)
*H03K 17/975* (2006.01)
*H03K 17/96* (2006.01)
*H03K 17/98* (2006.01)

(52) U.S. Cl.
CPC .......... *H03K 17/975* (2013.01); *H03K 17/962* (2013.01); *H03K 17/9622* (2013.01); *H03K 17/98* (2013.01)

(58) Field of Classification Search
CPC ............... H03K 17/962; H03K 17/98; H03K 17/9622; H03K 17/975; G01L 1/146; G01R 27/26; G01R 27/2605; G06F 3/041
USPC .......... 324/519, 548, 650–690; 345/173–178
See application file for complete search history.

(56) References Cited

U.S. PATENT DOCUMENTS

| | | |
|---|---|---|
| 5,047,622 A | 9/1991 | Chu |
| 6,373,467 B1 | 4/2002 | Slowinski et al. |
| 6,933,932 B2 | 8/2005 | Knowles |
| 7,053,529 B2 | 5/2006 | Knowles |
| 7,106,310 B2 | 9/2006 | Knowles et al. |
| 7,265,746 B2 | 9/2007 | Knowles et al. |
| 7,307,627 B2 | 12/2007 | Knowles et al. |
| 7,463,249 B2 | 12/2008 | Knowles et al. |
| 7,511,704 B2 | 3/2009 | Knowles et al. |
| 7,595,788 B2 | 9/2009 | Son |
| 7,812,269 B2 | 10/2010 | Knowles et al. |
| 7,940,249 B2 | 5/2011 | Perreault |

(Continued)

OTHER PUBLICATIONS

International Search Report for International Application No. PCT/US11/66569 dated Apr. 19, 2012; 2 pages.

(Continued)

*Primary Examiner* — Son Le
*Assistant Examiner* — Brent J Andrews

(57) ABSTRACT

A capacitance sense device can include a plurality of sense electrodes; a nonconductive structure comprising first regions formed over the sense electrodes and second regions formed between first regions that are less compressible than the first regions; a conductive touch surface formed over the nonconductive structure; and a capacitance sense circuit coupled to at least the sense electrodes.

18 Claims, 12 Drawing Sheets

(56) References Cited

U.S. PATENT DOCUMENTS

| | | |
|---|---|---|
| 2004/0125086 A1 | 7/2004 | Hagermoser et al. |
| 2004/0227740 A1 | 11/2004 | Knowles et al. |
| 2007/0075710 A1* | 4/2007 | Hargreaves et al. ......... 324/658 |
| 2007/0242037 A1 | 10/2007 | Son |
| 2007/0296709 A1* | 12/2007 | GuangHai .................... 345/173 |
| 2008/0001926 A1* | 1/2008 | XiaoPing et al. ............ 345/173 |
| 2008/0018611 A1* | 1/2008 | Serban et al. ................ 345/173 |
| 2008/0150905 A1 | 6/2008 | Grivna et al. |
| 2009/0290742 A1* | 11/2009 | Rosener ....................... 381/375 |
| 2010/0220070 A1* | 9/2010 | Niwa et al. ................... 345/173 |
| 2010/0271328 A1 | 10/2010 | Sekiguchi et al. |
| 2011/0025629 A1* | 2/2011 | Grivna et al. ................ 345/173 |
| 2011/0057899 A1 | 3/2011 | Sleeman et al. |
| 2011/0163764 A1* | 7/2011 | Shank et al. .................. 324/658 |

OTHER PUBLICATIONS

Written Opinion of the International Searching Authority for International Application No. PCT/US11/66569 dated Apr. 19, 2012; 4 pages.
SIPO Office Action for Application No. 201110460280.0 dated Jun. 24, 2016; 4 pages.

* cited by examiner

| BUTTON DIAM. (mm) | AIR GAP(mm) | RAW CNTS | DIFF. CNTS | NOISE | SNR |
|---|---|---|---|---|---|
| 11 | 1 | 6593 | 45 | 10 | 4.5 |
| 13 | 1 | 6818 | 80 | 10 | 8 |
| 9 | 2 | 6727 | 40 | 10 | 4 |
| 13 | 2 | 6622 | 60 | 10 | 6 |

Non-conductive Overlay Thickness = 1 mm
Hole Diameter = Button Diameter

FIG. 7A (RELATED ART)

| BUTTON DIAM. (mm) | AIR GAP(mm) | RAW CNTS | DIFF. CNTS | NOISE | SNR |
|---|---|---|---|---|---|
| 11 | 1 | 6520 | 20 | 7 | 2.9 |
| 13 | 1 | 6760 | 45 | 10 | 4.5 |
| 9 | 2 | 6621 | 21 | 10 | 2.1 |
| 13 | 2 | 6708 | 30 | 10 | 3 |

Non-conductive Overlay Thickness = 2 mm
Hole Diameter = Button Diameter

FIG. 7B (RELATED ART)

| BUTTON DIAM. (mm) | AIR GAP(mm) | RAW CNTS | DIFF. CNTS | NOISE | SNR |
|---|---|---|---|---|---|
| 11 | 1 | 56288 | 500 | 50 | 10 |
| 13 | 2 | 57325 | 700 | 45 | 15.5 |

Non-conductive Overlay Thickness = 1 mm
Hole Diameter > Button Diameter

FIG. 7C (RELATED ART)

| BUTTON DIAM. (mm) | AIR GAP(mm) | RAW CNTS | DIFF. CNTS | NOISE | SNR |
|---|---|---|---|---|---|
| 11 | 1 | 56225 | 400 | 50 | 8 |
| 13 | 2 | 57300 | 550 | 45 | 12.2 |

Non-conductive Overlay Thickness = 2 mm
Hole Diameter > Button Diameter

FIG. 7D (RELATED ART)

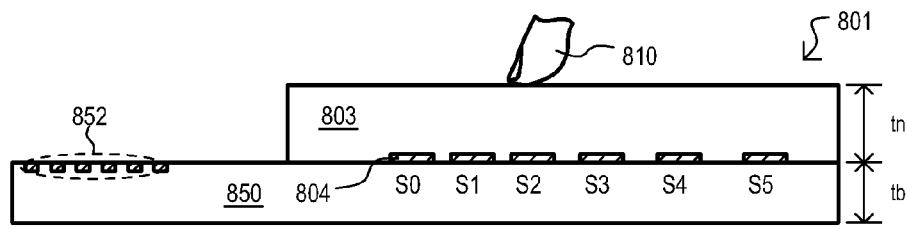
FIG. 8A (RELATED ART)
| SENSOR | Noise | No Finger Presence | | Finger Presence | |
|---|---|---|---|---|---|
| | | Raw Counts | Cp(pF) | Raw Counts | SNR |
| S0 | 3 | 590 | 4 | 720 | 43 |
| S1 | 3 | 630 | 4 | 755 | 42 |
| S2 | 5 | 642 | 4 | 760 | 23 |
| S3 | 2 | 482 | 3 | 625 | 70 |
| S4 | 3 | 264 | 2 | 425 | 53 |
| S5 | 4 | 182 | 1 | 340 | 40 |
FIG. 8B (RELATED ART)
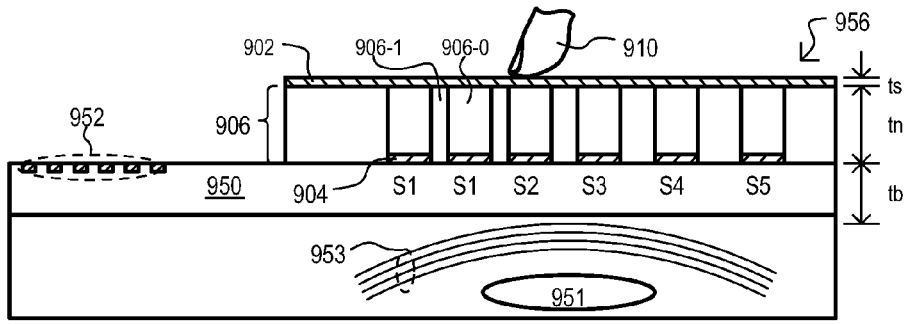
FIG. 9A
| SENSOR | Noise | No Finger Presence | | Finger Presence | |
|---|---|---|---|---|---|
| | | Raw Counts | Cp(pF) | Raw Counts | SNR |
| S0 | 6 | 10926 | 5 | 11024 | 16 |
| S1 | 7 | 11866 | 5 | 11960 | 13 |
| S2 | 6 | 12072 | 5 | 12152 | 12 |
| S3 | 8 | 9900 | 4 | 10000 | 12 |
| S4 | 6 | 6950 | 3 | 7055 | 17 |
| S5 | 8 | 6215 | 3 | 6370 | 19 |
FIG. 9B

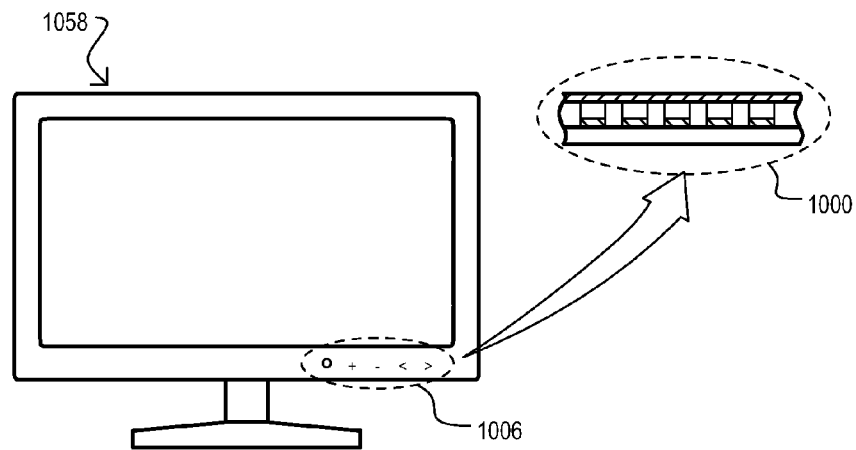
FIG. 10
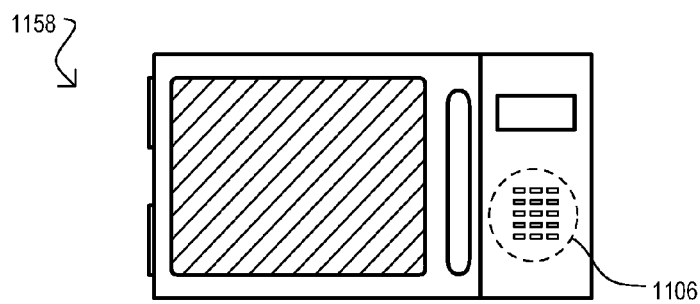
FIG. 11
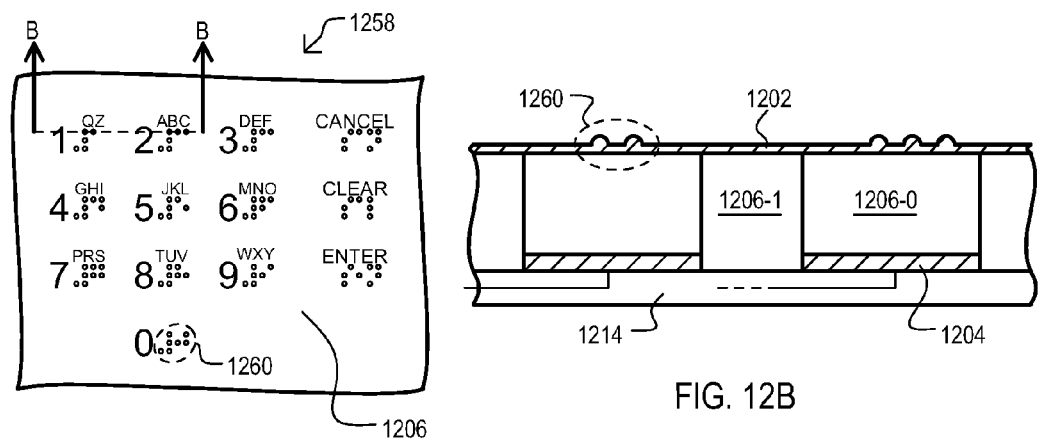
FIG. 12A
FIG. 12B

CAPACITANCE SENSING CIRCUITS, METHODS AND SYSTEMS HAVING CONDUCTIVE TOUCH SURFACE

TECHNICAL FIELD

The present disclosure relates generally to proximity and/or touch sensing systems, and more particularly to capacitance proximity/touch sensing systems and methods.

BACKGROUND

FIG. 15 shows a conventional capacitance sensing system 1500 that includes sense electrodes (one shown as 1502), grounded electrodes (two shown as 1504-0/1), and a capacitance sensing circuit 1506. In the absence of a sense object 1508 (e.g., part of a body such as a finger, a stylus, or other conductive object) a capacitance Cp exists between the sense electrode 1502 and ground. The presence of a sense object 1508 introduces a capacitance Cf.

Schematic 1510 shows a capacitance Cx sensed by capacitance sense circuit 1506. Cf varies according to the proximity of a sense object 1508. In particular, Cx will grow bigger in the presence of a sense object 1508.

Conventional system 1500 includes a nonconductive touch surface 1512 serving as a touch surface. Non-conductive touch surface 1512 prevents sense objects (e.g., 1508) from touching a sense electrode (e.g., 1502). Absent such a nonconductive touch surface 1512, when a sense object 1508 makes direct contact with sense electrode 1508, because it is a conductor to ground, it can increase a capacitance between all other sense electrodes and ground, erroneously triggering touch indications for all other sense electrodes.

The above limitation has prevented capacitance sensing on a contiguous conductive surface.

Other conventional sensing systems have utilized sense methods other than capacitance sensing in combination with a conductive sense surface. As a first example, conventional systems have utilized piezoelectric sensors in contact with a conductive surface. In response to strain induced by touch events, piezoelectric sensors can generate an electric field. Drawbacks to piezoelectric sensors can include difficulty in tuning responses to customer's liking, susceptibility to radio frequency (RF) noise/interference (e.g., 800 MHz, 1.9 GHz signals can interfere with sense results), and cost of components, as piezoelectric systems can require higher precision analog-to-digital converters.

As a second example, mechanical buttons can include conductive surfaces. Drawbacks to mechanical buttons can be susceptibility to wear and tear from moving/contacting parts and dust/debris. Other drawbacks include the expense in making mechanical buttons waterproof or resistant. Further, for many applications, mechanical buttons can lack the aesthetics for a given design.

BRIEF DESCRIPTION OF THE DRAWINGS

FIGS. 7A to 7D are tables showing sensing results of conventional capacitance sensing systems.

FIGS. 8A and 8B show a conventional capacitance sensing system with a nonconductive touch surface.

FIGS. 9A and 9B show a capacitance sensing system according to one embodiment that can be substituted for that shown in FIG. 8A.

FIG. 10 shows a consumer electronic system according to one embodiment.

FIG. 11 shows a consumer appliance system according to another embodiment.

FIGS. 12A and 12B are diagrams showing an input system according to a further embodiment.

DETAILED DESCRIPTION

Figure 1A:
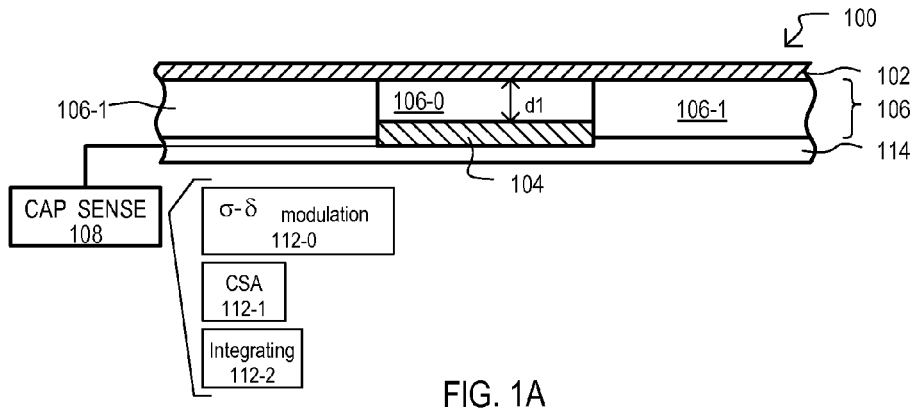
FIGS. 1A to 1C are diagrams showing capacitance sensing systems having a conductive touch surface according to embodiments.

Various embodiments will now be described that show capacitance sensing circuits, systems and methods that can utilize a conductive touch surface enabling capacitance sensing applications and capabilities beyond those achieved with conventional approaches requiring a nonconductive touch surface.

In the various embodiments shown below, like section are referred to by the same reference character but with the first digit(s) corresponding to the figure number.

Figure 1B:
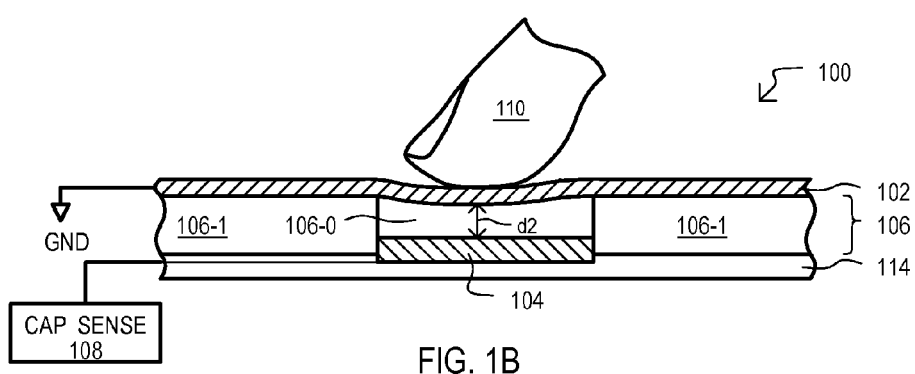

FIGS. 1A and 1B show a capacitance sensing system 100 according to an embodiment. A system 100 can include a conductive touch surface 102, one or more sense electrodes (one shown as 104), a nonconductive structure 106 formed between the touch surface 102 and sense electrodes (e.g., 104), and a capacitance sense circuit 108.

Figure 15:
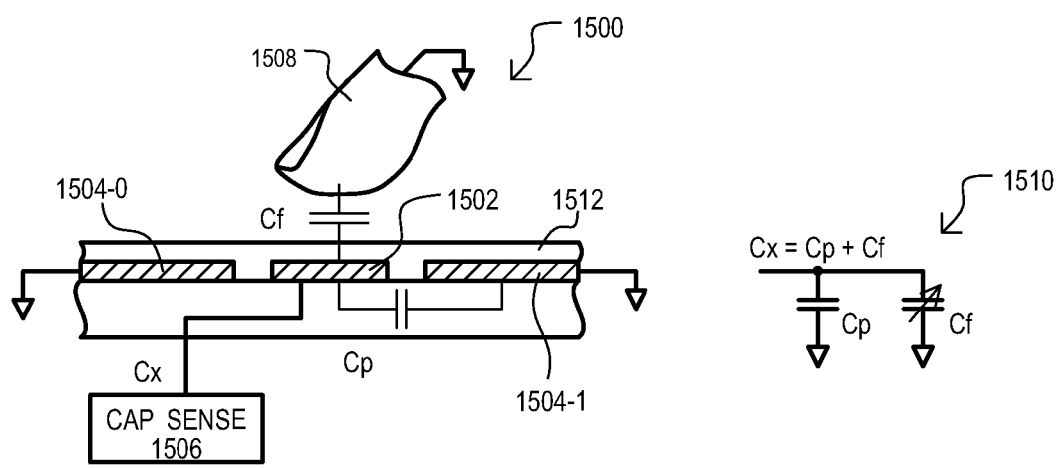
FIG. 15 is a block schematic diagram of a conventional capacitance sensing system.

A conductive touch surface 102 can be formed from one or more layers, one layer being formed from a conductive material for contact with a sense object (i.e., an object that contacts the touch surface to indicate an input event). This is in sharp contrast to a conventional system like that of FIG. 15 that may include a nonconductive touch surface 1512. A conductive touch surface 102 can be formed by any suitable conductive material, and in particular embodiments can include one or more metallic layers. Such a metallic layer can be composed of one metal, or may be an alloy. In some embodiments, a conductive touch surface 102 can be a contiguous structure formed over multiple sense electrodes (e.g., 104). However, in alternate embodiments a conductive touch surface 102 can be non-contiguous, having openings formed therein.

Sense electrodes (e.g., 104) can be formed below a touch surface 102 and can be physically separated from a touch surface 102 by a distance. As will be described below, in particular embodiments, such a distance can vary in response to a sense object (e.g., 110) contacting touch surface 102. When a sense object (e.g., 110) contacts a touch surface 102 over a sense electrode, the sense electrode can exhibit a change in capacitance. Thus, in some embodiments, each of sense electrodes (e.g., 104) can serve as a "button" that senses contact with the portion of the touch surface 102 above it.

Sense electrodes (e.g., 104) can be formed from any suitable conductive material. In some embodiments, sense electrodes (e.g., 104) can be substantially coplanar with one another. In addition or alternatively, sense electrodes (e.g., 104) can be parallel to touch surface 102. In FIGS. 1A and 1B, sense electrodes (e.g., 104) can be formed on a substrate 114. In a very particular embodiment, sense electrodes (e.g., 104) can be conductive regions formed on a printed circuit board (PCB), and substrate 114 can be a PCB with conductive layers formed therein to connect each sense electrode ((e.g., 104) to a capacitance sense circuit 108.

A nonconductive structure 106 can include first portions 106-0 and second portions 106-1. First portions 106-0 can be formed between each sense electrode (e.g., 104) and conductive touch surface 102 in a direction perpendicular to the touch surface 102. Second portions 106-1 can be formed between first portions 106-0 in a direction parallel to a touch surface 102. First portions 106-0 can be more compressible than second portions 106-1. In one embodiment, when a sense object (e.g., 110) presses down on a touch surface 102, a first portion 106-0 below the touch location can compress more than second portions 106-1, decreasing a distance between the corresponding sense electrode (e.g., 104) and touch surface 102, and thus increasing a capacitance.

In some embodiments, a nonconductive structure 106 can be a rigid, nonconductive layer positioned over sense electrodes (e.g., 104), and first portions 106-0 can be openings formed within such an overlay. Second portions 106-2 can be solid regions between such openings. In a very particular embodiment, a nonconductive structure 106 can be a polymer having openings formed therein, even more particularly an acrylic resin. In other embodiments, a nonconductive structure 106 can include a glass or any other suitable nonconductive material.

A capacitance sensing circuit 108 can be any suitable capacitance sensing circuit for detecting changes in a capacitance with respect to at least each sense electrode (e.g., 104). As shown in FIG. 1A, suitable capacitance sensing circuits include, but are not limited to: sigma-delta modulating (CSD) capacitance sense circuit 112-0, a successive approximation register (CSA) capacitance sense circuit 112-1, or an integrating type capacitance sense circuit 112-2.

FIG. 1A shows a system 100 prior to a touch event. Absent a sense object 110 there can be an initial distance (d1) between a sense electrode (e.g., 104) and touch surface 102. In a particular embodiment, a touch surface 102 can be connected to ground and a capacitance (Cinit) measured by capacitance sense circuit 108 can be given by the well-understood relationship $Cinit=\epsilon*(A/d1)$ where c is permittivity of a dielectric between sense electrode 104 and touch surface 102, and A is an area of parallel plates presented by sense electrode 104 and the corresponding portion of touch surface 102.

FIG. 1B shows a system 100 during a touch event. A touch surface 102 can be connected to ground. A sense object 110 can contact touch surface 102 and cause a distance between sense electrode (e.g., 104) and touch surface 102 to decrease from d1 to d2. Consequently, a capacitance measured by capacitance sense circuit 108 can be $Ctouch=\epsilon*(A/d2)$ where d2<d1.

Figure 1C:
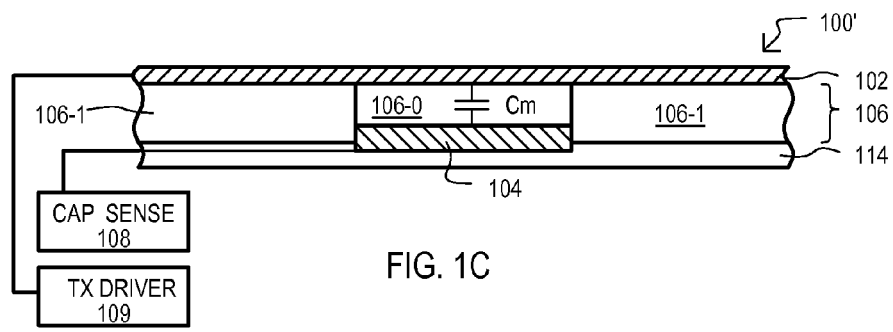

While FIGS. 1A and 1B have shown a system that can employ a self-capacitance sensing, alternate embodiments can utilize mutual capacitance sensing. FIG. 1C shows one example of such an embodiment.

FIG. 1C shows a system 100' having items like those of FIG. 1A. However, unlike FIG. 1A, in FIG. 1C a conductive touch surface 102 can be driven with a transmit signal TX. A mutual capacitance (Cm) between the conductive touch surface 102 and sense electrode (e.g., 104) can increase when an object presses on the conductive touch surface 102, decreasing a distance between the two.

In this way, touches on a conductive surface can be capacitively sensed.

Figure 2:
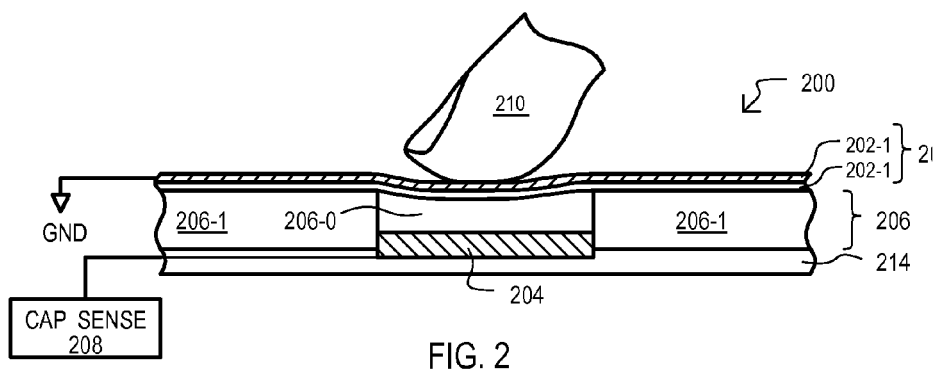
FIG. 2 is a diagram showing a capacitance sensing system having a multi-layer conductive touch surface according to an embodiment.

FIG. 2 shows a capacitance sensing system 200 according to another embodiment. A system 200 can include items like those of FIGS. 1A and 1 B, and such items can be subject to the same variations as noted for the embodiment of FIGS. 1A/1B.

FIG. 2 differs from FIGS. 1A and 1B in that a conductive touch surface 202 can include multiple layers 202-0, 202-1. A top layer 202-0 (i.e., layer that is touched) can be a conductive layer, while one or more lower layers (e.g., 202-1) can be nonconductive or conductive. In one particular embodiment, a top layer 202-0 can be a conductive paint, while a lower layer 202-1 can be a flexible sheet, such as plastic, as but one example.

Embodiments above have shown systems in which a compressible region (e.g., an opening) can have a same width as a corresponding sense electrode (where width is determined in a direction parallel to a touch surface 302). However, other embodiments can include variations in size between compressible portions corresponding sense electrodes.

Figure 3A:
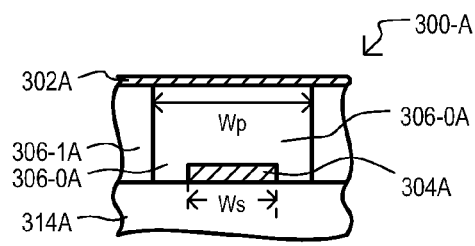
FIGS. 3A to 3E are cross sectional views showing embodiments having variations between a sense electrode dimension and corresponding compressible region formed above the sense electrode, as well as shape of a conductive touch surface.
Figure 3B:
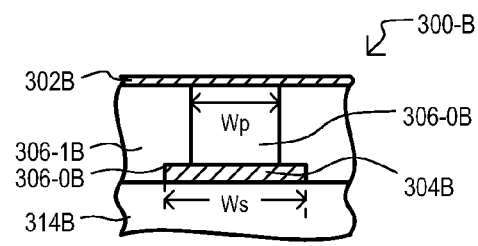

FIGS. 3A and 3B show sense systems 300-NB having features like those of FIGS. 1A and 2. FIG. 3A differs from the above embodiments in that a width of a compressible portion 306-0A (Wp) can be greater than a width (Ws) of a corresponding sense electrode 304-A. Thus, a compressible portion (e.g., an opening) can extend beyond some or all of the edges of the corresponding sense electrode.

FIG. 3B differs from the above embodiments in that a width of a compressible portion 306-0B (Wp) can be less than a width (Ws) of a corresponding sense electrode 304-B. Thus, a sense electrode can extend beyond some or all of the edges of the corresponding compressible portion.

Figure 3C:
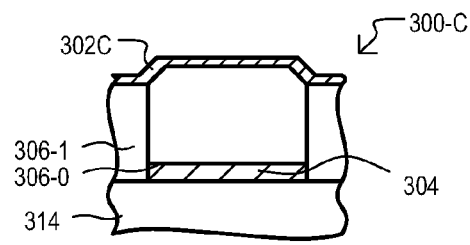
Figure 3D:
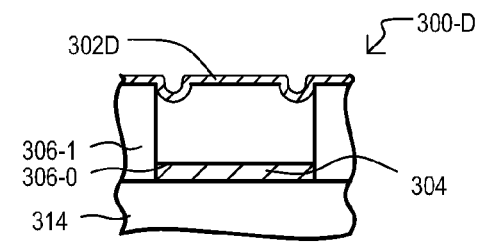
Figure 3E:
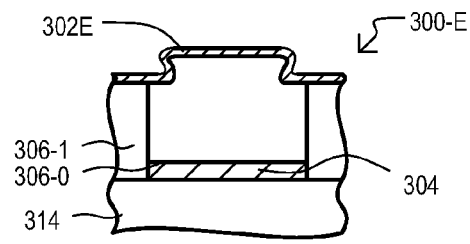

While embodiments shown herein include touch surfaces that are flat, alternate embodiments can include touch surfaces with various other surface forms. FIGS. 3C to 3E show three examples of variations in touch surface shape. FIGS. 3C to 3E shows how touch surfaces 302C, 302D and 302E can have portions that rise above and/or fall below other portions of the same surface. Such features can provide a tactile indication of where a sense electrode is located (and hence where the surface can be touched) and/or a mechanical spring effect.

It is understood that FIGS. 3C to 3E are but a few of many possible alternate embodiments.

Embodiments above shown capacitance sense systems having a conductive touch surface with sense electrodes formed below. Alternate embodiments can advantageously utilize a conductive touch surface as a capacitance based proximity sense electrode. In such embodiments, a system can switch between a proximity sensing mode and a touch sensing mode. Particular embodiments having such capabilities will now be described.

Figure 4A:
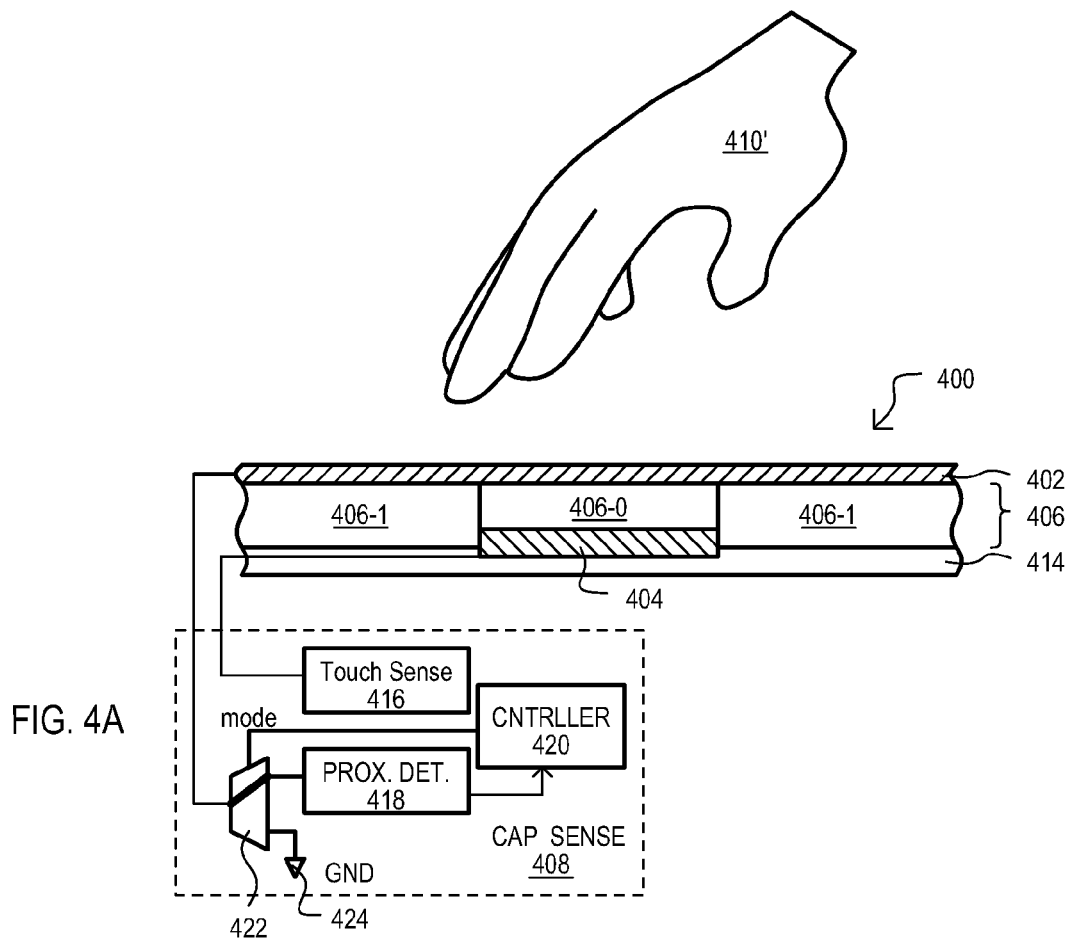
FIGS. 4A to 4D are diagrams showing capacitance sensing systems having a conductive touch surface that can also serve as a proximity sensing electrode, according to embodiments.
Figure 4B:
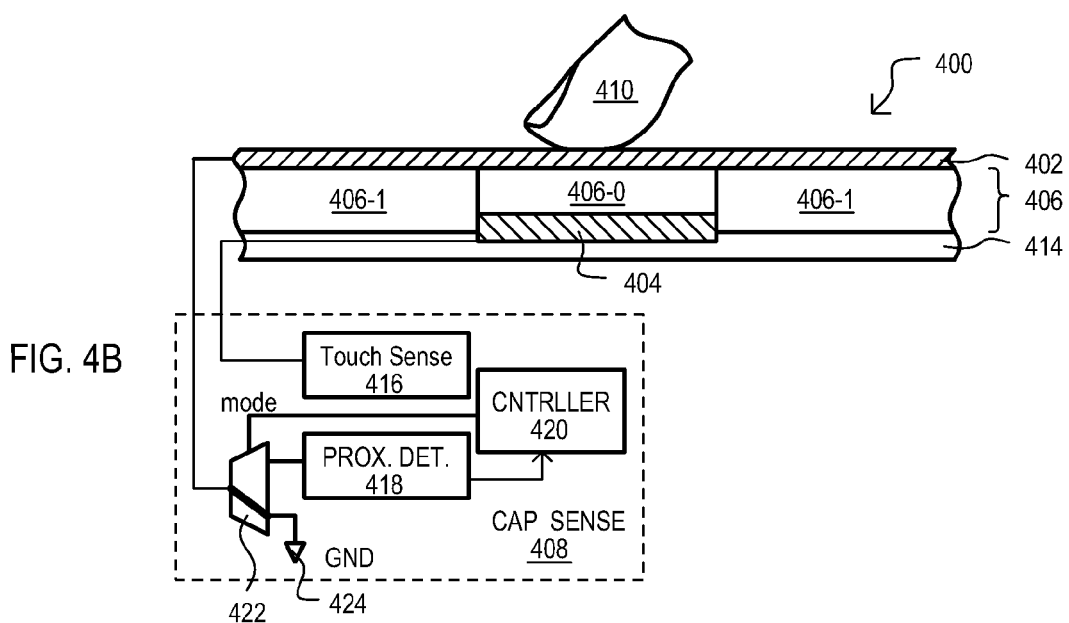

FIGS. 4A and 4B show a system 400 having sections like those of FIGS. 1A/B. FIGS. 4A/B differ from FIGS. 1A/B in that a capacitance sense circuit 408 can include touch sense circuits 416, proximity sense circuits 418, a controller 420, and a mode switch 422. Touch sense circuits 416 can detect changes in capacitance between a sense electrode 404 and conductive touch surface 402. Proximity sense circuits 418 can sense capacitance changes with respect to touch surface 402 (e.g., capacitance between touch surface 402 and ground). It is understood that touch sense and proximity sense circuits (416 and 418) can include the same circuit components, share some circuit components, or can be separate circuits.

A controller 420 can control sense operations of capacitance sensing circuit 408, including operations of mode switch 422. As will be described in more detail below, a controller 420 can switch system 400 between different operations.

A mode switch 422 can selectively switch a touch surface 402 between different nodes depending upon a mode of operation. In the particular embodiment shown, a switch circuit 422 can include a multiplexer that switches a touch surface 402 between a proximity sense circuit 418 and a ground node 424.

FIG. 4A shows a system configured for a first mode of operation. In response to a mode signal from controller 420, a mode switch 422 can connect conductive touch surface 402 to proximity sense circuits 418. Touch sense circuits 416 can be deactivated. In a first mode, a capacitance of touch surface 402 can be sensed by proximity sense circuit 418 to detect when a proximity sense object 410' approaches the touch surface 402. In one embodiment, upon detecting the proximity of sense object 410' a controller can switch to a second mode of operation.

FIG. 4B shows a system configured for a second mode of operation. In response to a mode signal from controller 420, a mode switch 422 can connect conductive touch surface 402 to ground node 424. In addition, touch sense circuits 416 can be activated, while proximity sense circuits 418 can be deactivated. In a second mode, a capacitance of sense electrodes (e.g., 404) can be sensed to determine if a touch has occurred on touch surface 402 above such sense electrodes.

Figure 4C:
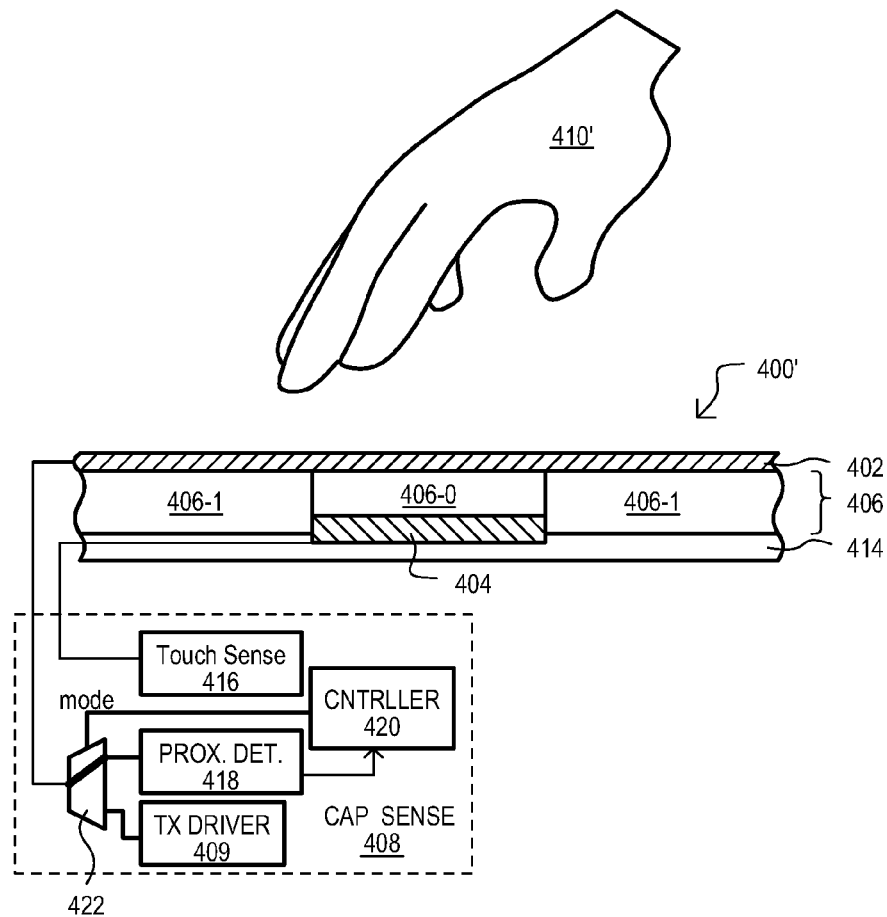
Figure 4D:
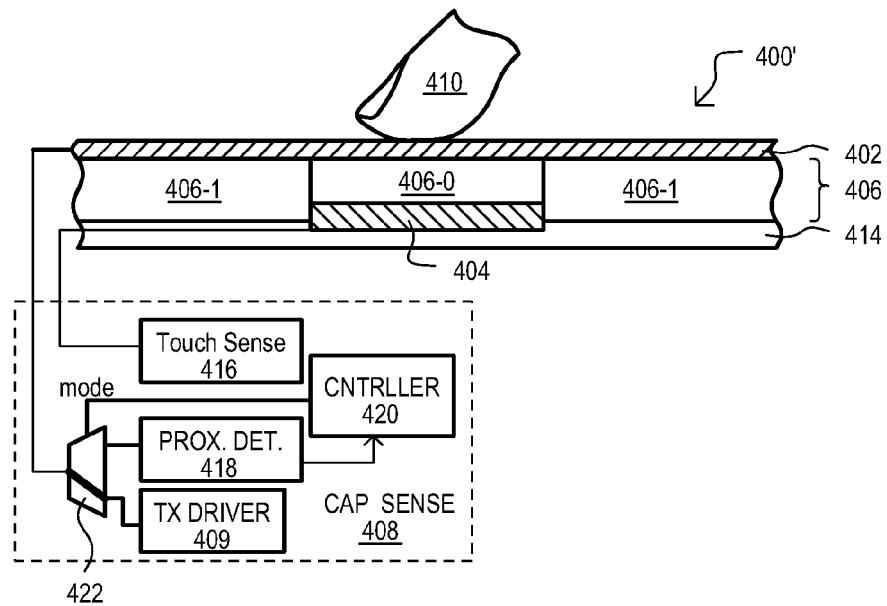

FIGS. 4C and 4D show a system 400' having sections like those of FIGS. 4A/B. FIGS. 4C/D differ from FIGS. 4A/B in that a mode switch 422 can connect touch surface 402 to a transmit signal driver circuit 409 in a second mode of operation. Touch sense circuits 416 can then employ mutual capacitance sensing to detect a touch above a sense electrode (e.g., 404).

In this way, a capacitance sense system can utilize a conductive surface for proximity sensing in one mode, and as a conductive capacitance sensing touch surface in another mode.

Figure 5:
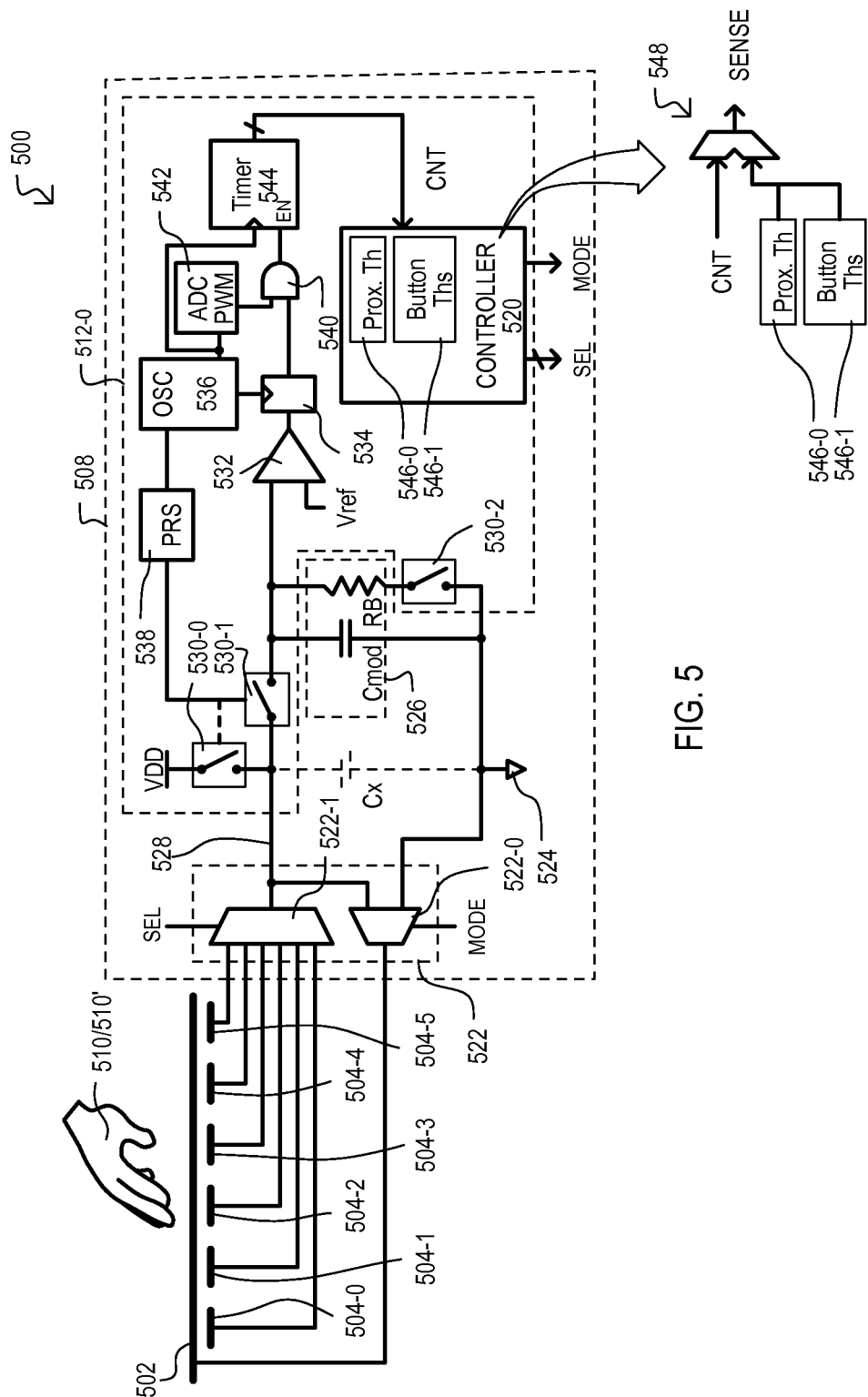
FIG. 5 is a schematic diagram of a capacitance sensing system that can provide proximity and "button" type sensing according to one embodiment.

FIG. 5 shows a capacitance sensing system 500 according to another embodiment. In a very particular arrangement, system 500 can be one particular implementation of that shown in FIGS. 4A/B.

A system 500 can include a conductive touch surface 502, sense electrodes 504-0 to -5 formed below the touch surface 502, and a capacitance sense circuit 508. A capacitance sense circuit 508 can include a mode switch circuit 522, a sigma-delta modulation (CSD) circuit 512-0, a controller 520, and components 526. A mode switch circuit 522 can include a touch surface MUX 522-0 and an electrode MUX 522-1. A touch surface MUX 522-0 can switch a touch surface 502 between a sense node 528 and a ground node 524 in response to a mode signal MODE. An electrode MUX 522-1 can connect any of sense electrodes (504-0 to -5) to sense node 528 in response to a select signal SEL.

A CSD circuit 512-0 can detect capacitance changes at a sense node 528. In the particular embodiment shown, a CSD circuit 512-0 can include charge switch 530-0, sample switch 530-1, discharge switch 530-2, a comparator 532, a latch 534, an oscillator circuit 536, a pseudorandom sequence generator 538, gate 540, analog-to-digital converter/pulse width modulator (ADCPWM) 542, and timer 544. According to known sigma-delta modulating capacitance sense techniques, switches 530-0 to -1 can form a switched capacitor circuit that charges modulating capacitor (Cmod). Modulating capacitor (Cmod) discharges through bleed resistor RB. Pulses generated by comparator 532 can be converted into count values (CNT) by timer 544. Such count values can be provided as sensed capacitance values to controller 520.

Components 526 can include passive circuit components selected for an expected capacitance to be sensed, a desired response speed, and/or touch sensitivity. In the embodiment shown, components can include a modulating capacitor Cmod and a bleed resistor RB.

A controller 520 can store, and/or have access to, threshold values for determining a sense event. In the particular embodiment shown, a controller 520 can include storage locations 546-0 for storing one or more proximity threshold values and storage locations 546-1 for storing one or more button threshold values corresponding to each sense electrode. A controller 520 can also include comparator circuits (represented by 548) for comparing threshold values in storage locations (546-0, 546-1) to count values (CNT) output from timer 544.

In a very particular embodiment, a controller 520 can include a processor that executes stored instructions. In such an embodiment, a comparator 548 can be formed by an arithmetic logic unit (ALU) of the processor. However, in alternate embodiments, all or portions of a controller 520 can be formed by custom circuits and/or programmable circuits.

Having described various sections of a system 500, two modes of operation for the system will now be described.

In a first mode of operation, a system 500 can operate in a proximity sensing mode, determining if a conducting object is in proximity to a touch surface 502. In a first mode, a controller 520 can generate mode signals (MODE) that cause touch surface MUX 522-0 to connect touch surface 502 to sense node 528, and select signals SEL that disconnect sense electrodes (504-0 to -5) from sense node 528. CSD circuit 512-0 can begin generating count values (CNT) based a sensed capacitance Cx between sense node 528 and a ground node 524. A controller 520 can compare count values (CNT) to proximity threshold values in storage locations 546-0. If count values exceed a proximity threshold value, a controller 520 can determine a proximity sense object (510') is within proximity of touch surface 502. In particular embodiments, upon detecting the proximity of an object, a system 500 can switch to a second mode.

In a second mode of operation, a system 500 can sense if touches occur on touch surface 502 above any of the sense electrodes (504-0 to -5), enabling regions above the sense electrodes (504-0 to -5) to operate as touch "buttons". A controller 520 can generate mode signals (MODE) that cause touch surface MUX 522-0 to connect touch surface 502 to ground node 524. In addition, controller 520 can generate select signals SEL that can sequentially connect each sense electrode (504-0 to -5) to sense node 528. CSD circuit 512-0 can generate count values (CNT) based a sensed capacitance Cx, which can represent a capacitance change between a sense electrode (504-0 to -5) and touch surface 502. A controller 520 can compare count values (CNT) for each sense electrode (504-0 to -5) (i.e., button) to a corresponding button threshold value in storage locations 546-1. If count values exceed a button threshold value, a controller 520 can determine that a touch has occurred above the corresponding sense electrode (504-0 to -5).

It is understood that a controller can include various additional processes that operate on count values (CNT) before and/or after comparison to threshold values. Such additional processes include, but are not limited to, filtering and/or hysteresis with respect to count values and threshold limits.

While a system 500 can be implemented with various circuit types, in one very particular embodiment, a capacitance sense circuit 508 can be formed with a programmable system on chips device, such as the PSoC®3 and/or PSoC®5 device manufactured by Cypress Semiconductor Corporation of San Jose, Calif., U.S.A.

Figure 6A:
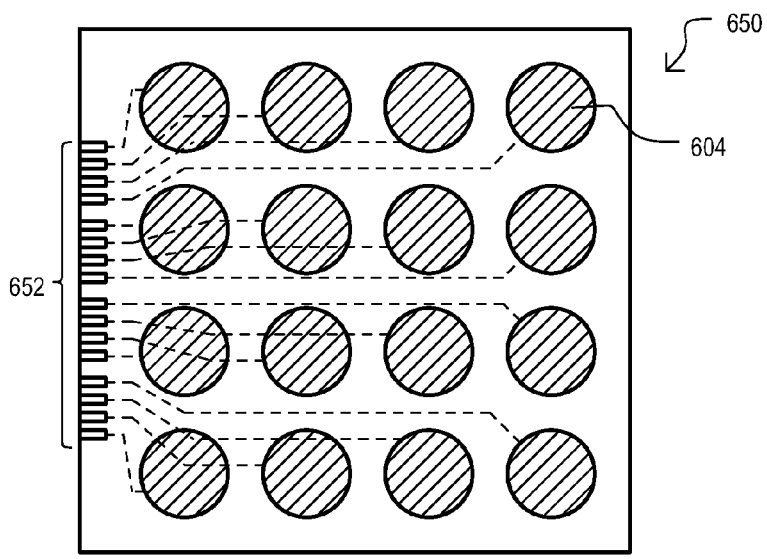
FIGS. 6A to 6C are diagrams showing parts of a sense assembly according to an embodiment.
Figure 6B:
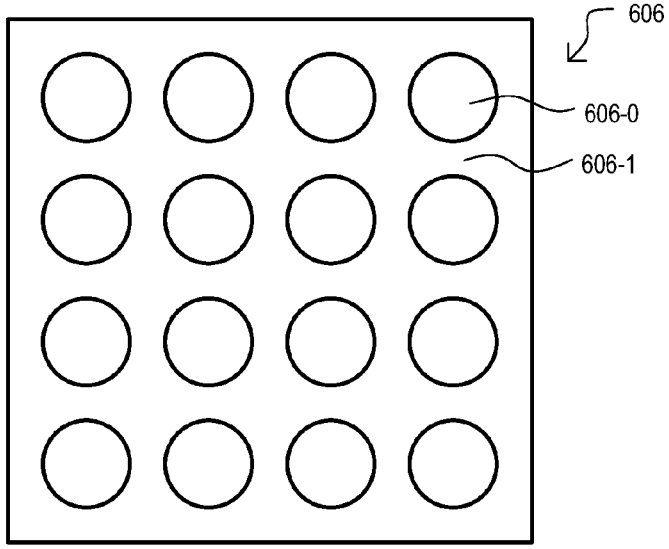
Figure 6C:
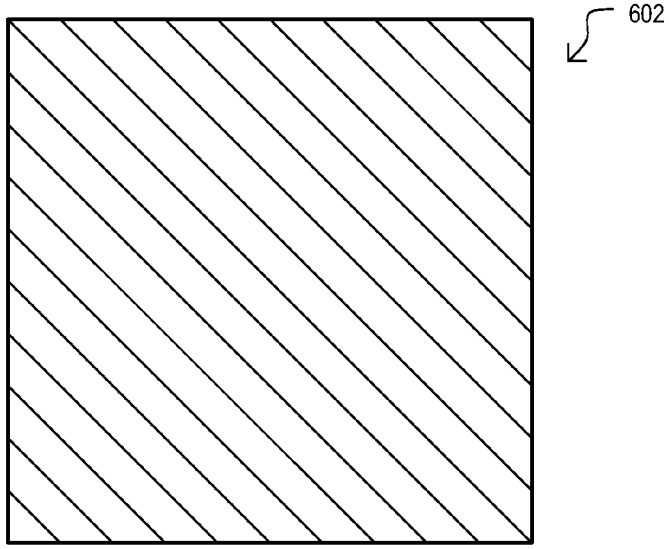

FIGS. 6A to 6C show components of a sense assembly that can be included in embodiments. FIG. 6A shows a bottom section 650. A bottom section 650 can be a PCB having sense electrodes (one shown as 604) patterned thereon. In the particular embodiment shown, sense electrodes (e.g., 604) are circular shaped in a four-by-four array. However, sense electrodes can have any suitable shape according to a desired application. Sense electrodes (e.g., 604) can have conductive connections to corresponding leads 652. Leads 652 can be connected to a capacitance sense circuit (not shown).

FIG. 6B shows a nonconductive structure 606 that can be attached to be situated over bottom section 650. In the particular embodiment shown, nonconductive structure 606 can be single, relatively rigid sheet with openings (one shown as 606-0) formed therein. Openings 606-0 can form compressible regions with respect to a touch surface (not shown). Areas between openings (shown as 606-1) can form less, or non-compressible regions. In the particular embodiment shown, openings (e.g., 606-0) can have a same size as, and can be vertically aligned with, sense electrodes (e.g., 604) of bottom section 604. However, as understood with reference to FIGS. 3A/3B, openings (e.g., 606-0) can have dimensions different than those of their corresponding sense electrodes. A nonconductive structure 606 can be made from any suitable nonconductive material, including those noted for item 106 in FIGS. 1A/1B, or equivalent materials. A nonconductive structure 606 can be physically attached to bottom structure 650.

FIG. 6C shows a conductive touch surface 602 according to an embodiment. A touch surface 602 can be an integral conductive structure attached to nonconductive structure 606. In a particular embodiment, a touch surface 602 can have a uniform thickness, and can be a metallic sheet, as but one example.

It is understood that FIGS. 6A to 6C show but one very particular embodiment, and should not be construe as limiting.

FIGS. 7A to 7D are tables showing experimental results for conventional sensing systems. Each of the tables includes the following columns: BUTTON DIAM., which shows a diameter of a sense electrode in millimeters (mm); AIR GAP shows a distance between a touch surface and a sense electrode (i.e., vertical depth of an opening) absent an object touching a touch surface in mm; RAW CNTS shows a number of raw counts (background counts) generated by a CSD type capacitance sense circuits; DIFF CNTS can be a change in counts resulting from an object touching a touch surface above a sense electrode; NOISE can be counts attributed to noise in RAW CNTS; and SNR can be a resulting signal-to-noise ratio of the system.

FIG. 7A shows results for a conventional arrangement in which a non-conductive touch surface has a 1 mm thickness. Further, a hole diameter (e.g., compressible portion of a nonconductive structure) matches that of the sense electrodes (i.e., the button diameter).

FIG. 7B shows results for a conventional arrangement in which a non-conductive touch surface has a 2 mm thickness and hole diameters match sense electrode diameters.

FIG. 7C shows results for a conventional arrangement in which a non-conductive touch surface has a 1 mm thickness and hole diameters are greater than sense electrode diameters.

FIG. 7D shows results for a conventional arrangement in which a non-conductive touch surface has a 2 mm thickness and hole diameters are greater than sense electrode diameters.

It is expected that embodiments described herein can be used to replace or improve existing conventional piezoelectric, mechanical button and/or capacitance sensing systems. In the latter case, conventional sense electrode structures can be used in combination with a newly added conductive touch surface to improve a function of, or aesthetics in, an application. FIGS. 8A to 8D show an example of such a case.

FIGS. 8A and 8B show a conventional capacitance sensing input structure 801 for an electronic device, such as a monitor or television, for example. Input structure 801 can include a PCB 850 and a nonconductive touch surface 803. Sense electrodes (S0 to S5) (one shown as 804) can be patterned layers on a surface of PCB 850. In a particular embodiment, a nonconductive touch surface 803 can be a plastic layer. Sense electrodes 804 can have conductive connections to leads 852 through PCB 850.

In one implementation, a PCB 850 can have a thickness (tb) of about 1 mm and a nonconductive touch surface 803 can have a thickness (tn) of about 1.6 mm.

When a sense object 810 is in proximity with a sense electrode 804, it can induce a change in capacitance with respect to the sense electrode.

FIG. 8B is a table showing sense results for the conventional structure of FIG. 8A. The table of FIG. 8B includes the following columns: SENSOR, which identifies the sensor; NOISE can be counts attributed to noise; Raw Counts, can shows a number of raw counts generated by a CSD type capacitance sense circuit; Cp can be a capacitance sensed by a system (in picoFarads), SNR can be a resulting signal-to-noise ratio of the system. FIG. 8B shows count values and capacitance values when no finger is present over a sense electrode (No Finger Presence), and when a finger is present over a sense electrode (Finger Presence).

FIGS. 9A and 9B show a capacitance sensing input structure 956 according to an embodiment. In a particular embodiment, input structure 956 can serve as a substitute for that shown in FIG. 8A. Input structure 956 can include a PCB 950, a nonconductive structure 906, and a conductive touch surface 902. As in the case of FIG. 8A, sense electrodes (S0 to S5) (one shown as 904) can be patterned layers on a surface of PCB 950 having conductive connections to leads 952. A nonconductive structure 906 can be a plastic layer having compressible portions (one shown as 906-0) and less compressible portions (one shown as 906-1). In one embodiment, a nonconductive structure 906 can be a plastic layer and compressible portions 906-0 can be openings formed in the plastic layer. In one embodiment, a PCB 950 can be substantially the same as that utilized in a conventional capacitance sensing system 801.

In one implementation, a PCB 950 can have a thickness (tb) of about 1 mm and a nonconductive structure 906 can have a thickness (tn) of about 1.2 mm, and a conductive touch surface 902 can have a thickness (ts) of about 0.2 mm. Accordingly, embodiment 956 can have a form factor suitable for replacing that of FIG. 8A.

When a sense object 910 contacts (e.g., a gentle press) a touch surface 902 over a sense electrode (S0 to S5), a change in capacitance between the sense electrode and touch plate can occur, indicating a touch event.

FIG. 9B is a table showing sense results for the embodiment of FIG. 9A. The table of FIG. 9A includes the same columns as those of FIG. 8B.

In a particular embodiment, a capacitance sensing input structure 956 can include backlighting that can illuminate a touch surface 902 from behind. In one very particular embodiment a light source 951 can be positioned behind a PCB and provide light (e.g., 953) to a back of PCB 950. A PCB 950 and/or touch surface 902 can have openings that enable light to shine through.

In this way, a sensing system having a conductive touch surface can be used in applications having conventional capacitance sensing with a nonconductive touch surface.

Embodiments of the invention can include various electrical and/or electromechanical devices employing capacitive sensing with a conductive touch surface as described herein, equivalents. As but a few examples, systems according to embodiments described herein can include electronics products, automation products, appliances (e.g., "white" goods), as well as automotive, aeronautic and/or nautical devices. Particular examples of such embodiments will now be described. The below embodiments can utilize touch sensing based on a capacitance changes between a conductive touch surface and sense electrodes as described herein, or equivalents.

Further, such embodiments can also include proximity sensing in combination with such touch sensing, in which a conductive touch surface is utilized as a proximity sensing electrode.

FIG. 10 shows a system 1058 according to a particular embodiment. A system 1058 can be a display device having a conductive touch surface 1006 formed thereon. A touch surface 1006 can form part of a sensing system 1000 (shown in a cross section) like that shown in embodiments above. In a particular embodiment, a touch surface 1006 can be a portion of a larger contiguous metallic surface, for a desirable aesthetic. Such a contiguous surface can also enable high resistance to moisture for easy cleaning.

FIG. 11 shows another system 1158 according to an embodiment. A system 1158 can be a household appliance. As in the case of FIG. 10, an appliance can include a conductive touch surface 1106 to control the system 1158. In a particular embodiment, a touch surface 1106 can be a portion of a larger contiguous metallic surface for advantages noted in the embodiment of FIG. 10.

FIGS. 12A and 12B show another system 1258 according to an embodiment. A system 1258 can be a touch interface for a device, such as an automatic teller machine (ATM), as but one embodiment. FIG. 12A shows a top plan view of a touch surface 1206. FIG. 12B shows a side cross sectional view through a portion of the touch interface, shown by line B-B in FIG. 12A.

FIGS. 12A/B show how a system 1258 can include tactile features (one shown as 1260) on a touch surface 1206 to delineate touch locations. In this way, "buttons" can be designated regions of a contiguous conductive structure, and not mechanical buttons integrated into a surface. Tactile features (e.g., 1206) can delineate "button" center locations, button perimeters, or both.

FIG. 12B shows items like those of FIG. 1A, and such items can be formed of the same or equivalent structures as FIG. 1A. In addition, FIG. 12B shows how tactile structures (e.g., 1260) can identify touch locations (e.g., "buttons") on a contiguous touch surface 1202.

While embodiments above have shown systems, circuits, and associated methods, additional method embodiments will now be described with reference to a number of flow diagrams.

Figure 13:
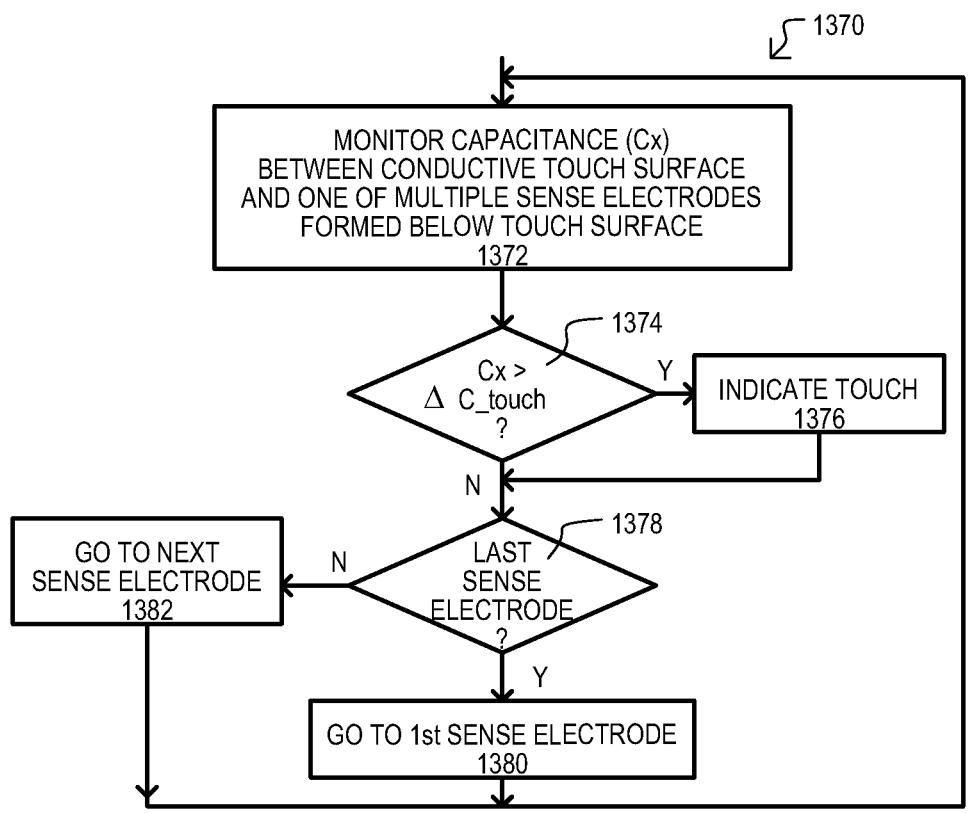
FIG. 13 is a flow diagram of a method according to an embodiment.

FIG. 13 shows a method 1370 according to one embodiment. A method 1370 can include monitoring a capacitance between a conductive touch surface and one of multiple sense electrodes formed below the touch surface (1372). In a particular embodiment, such an action can include connecting a touch surface to ground, and sensing a capacitance between each sense electrode and ground. Further, such sensing can include any suitable capacitance sensing method. In a particular embodiment, such capacitance sensing can include sigma-delta modulation capacitance sensing as described herein, or an equivalent capacitance sensing approach.

If a sensed capacitance is greater than a minimum capacitance change ($\Delta C\_touch$) required to indicate a touch (Y from 1374), a touch can be indicated (1376). Such an action can include indicating a touch event for the particular electrode to enable an electrode to operate as a "button". After indicating a touch, a method 1370 can proceed to 1378. If a sensed capacitance is not outside of a range (N from 1374), a method 1370 can determine if a last sense electrode has been reached 1378.

If a last sense electrode has not been reached (N from 1378), a method 1370 can go to a next sense electrode 1382, and then return to 1372. If a last sense electrode is reached (Y from 1378), a method 1370 can go to a first sense electrode 1382, and then return to 1372.

Figure 14:
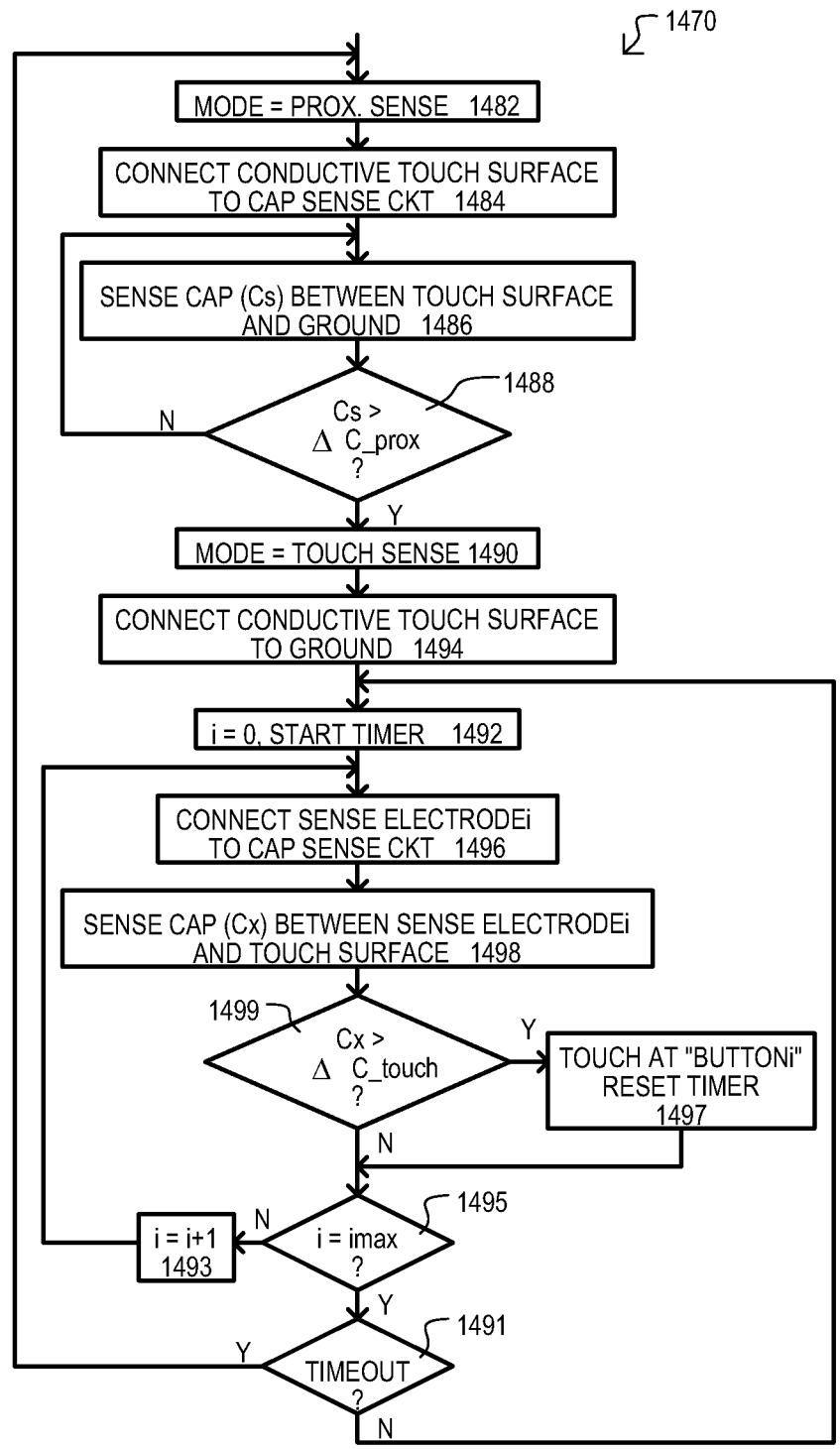
FIG. 14 is a flow diagram of a method according to another embodiment.

FIG. 14 shows a method 1470 according to another embodiment. A method 1470 can include setting a mode to a proximity sensing mode (1482). A conductive touch surface can be connected to a capacitive sense circuit (1484). A capacitance between a touch surface and ground (Cs) can be sensed (1486). Such an action can include any of the sensing methods noted for embodiments herein, or equivalents. If a sensed capacitance is not greater than a minimum capacitance change ($\Delta C\_prox$) (N from 1488), a method 1470 can return to 1486 and proximity sensing with a touch surface can continue. A minimum capacitance change ($\Delta C\_prox$) can be a value for determining if an object is within a proximity of a touch surface. Such a value can vary according to operating environment and/or application.

If a sensed capacitance is greater than a minimum capacitance change ($\Delta C\_prox$) (Y from 1488), a method 1470 can switch to a touch sense mode (1490). A conductive touch surface can be connected to a ground (1494). Initial values for sensing capacitance for multiple electrodes can be set. In the embodiment shown, this can include setting an electrode selection value (i) to zero, and starting a time out counter (1492).

A selected sense electrode can be connected to a capacitance sense circuit (1496). A capacitance between a touch surface and a selected electrode can be sensed (1498). Such an action can include any of the sensing methods noted for embodiments herein, or equivalents. If a sensed capacitance is greater than a minimum capacitance (ΔC_touch) (Y from 1499), a method 1470 can determine that a touch has occurred at a "button" corresponding to the selected electrode, and a timer can be reset (1497). Such a touch indication can be provided to other portions of a system as input events, for example.

If a sensed capacitance is not greater than a minimum capacitance (ΔC_touch) (N from 1499), a method 1470 can check if a last sense electrode has been reached (i=imax) (1495). If a last sense electrode has not been reached (N from 1495), a next sense electrode can be selected (1493). If a last sense electrode has been reached (Y from 1495), a method 1470 can check if a timer has reached a timeout limit (1491). If a timeout limit has not been reached (N from 1491), a method 1470 can return to 1492 to repeat a scanning of the sense electrodes. If a timeout limit has been reached (Y from 1491), a method 1470 can return to 1482 and enter the proximity sensing mode.

Embodiments can enable touch inputs to be entered on a conductive surface. Such embodiments can provide highly desirable aesthetic by enabling a contiguous metallic surface to serve as a touch surface. In addition, such embodiments can provide for more water resistant designs, as a contiguous sensing surface can be formed from a single metal sheet.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A capacitance sense device, comprising:
    a plurality of sense electrodes;
    a conductive touch surface configured to receive direct contact by a conductive object;
    a nonconductive structure comprising first nonconductive regions formed between the conductive touch surface and each of the plurality of sense electrodes, and second nonconductive regions that are less compressible than the first nonconductive regions, each of the second nonconductive regions formed adjacent to at least one of the first nonconductive regions, wherein the conductive touch surface overlies both of the first nonconductive regions and the second nonconductive regions so that a portion of the conductive touch surface overlying the first nonconductive regions is capable of being displaced in response to the direct contact; and
    a capacitance sense circuit coupled to at least the sense electrodes, the capacitance responsive to the direct contact by the conductive object.

2. The capacitance sense device of claim 1, wherein the sense electrodes comprise conductive areas of a printed circuit board.

3. The capacitance sense device of claim 1, wherein the nonconductive structure comprises a rigid layer, and the first nonconductive regions comprise openings in the rigid layer.

4. The capacitance sense device of claim 1, wherein:
    the sense electrodes and first nonconductive regions have widths in a direction parallel to touch surface, and a width of at least one first nonconductive region is selected from: a same width as a corresponding sense electrode; a smaller width than the corresponding sense electrode; and a greater width than the corresponding sense electrode.

5. The capacitance sense device of claim 1, wherein the conductive touch surface comprises a contiguous structure formed over the sense electrodes.

6. The capacitance sense device of claim 1, wherein the conductive touch surface is selected from: a rigid layer of metal; a flexible conductive layer; a conductive paint formed on a flexible nonconductive layer.

7. The capacitance sense device of claim 1, further including:
    a switch circuit that selectively connects at least one sense electrode to the capacitance sense circuit; and
    the capacitance sense circuit comprises a sigma-delta modulation capacitance sense circuit.

8. A capacitance sensing system, comprising:
    a plurality of sense electrodes;
    a conductive surface configured to receive contact by a sense object,
    wherein at least a portion of the conductive surface overlies both of a first nonconductive region and a second nonconductive region that is less compressible than the first nonconductive region so that a portion of the conductive touch surface overlying the first nonconductive regions is capable of being displaced in response to the contact; and
    a capacitance sensing circuit configured to detect changes in capacitance between the conductive surface and each sense electrode in response to contact made between the sense object and the conductive surface, wherein a change in capacitance of the conductive surface and a sense electrode, of the plurality of sense electrodes, is responsive to a change in distance between the conductive surface and the sense electrode.

9. The capacitance sensing system of claim 8, wherein:
    the conductive surface comprises a contiguous conductive layer; and
    the sense electrodes are substantially coplanar and parallel to the conductive surface.

10. The capacitance sensing system of claim 8, wherein the capacitance sensing circuit includes:
    a store for storing at least one proximity threshold value and at least one touch threshold value for each sense electrode; and
    at least one comparator circuit configured to compare a capacitance reading from the conductive surface to the at least one proximity threshold value and to compare capacitance readings for each sense electrode to its corresponding touch threshold value.

11. The capacitance sensing system of claim 8, further including a switching circuit that couples the conductive surface to a sense node in a first mode, and selectively couples sense electrodes to the sense node in a second mode.

12. The capacitance sensing system of claim 11, wherein the switching circuit further couples the conductive surface to a ground node in the second mode.

13. The capacitance sensing system of claim 8, further including a non-conductive overlay that includes first regions formed between the conductive surface and each sense electrode and a second regions formed between first regions, the first regions being more compressible than the second regions in response to pressing on the conductive surface.

14. The capacitance sensing system claim 8, wherein the conductive surface comprises a surface of an electronic device.

15. A method, comprising:
in a first mode, detecting touches of an object at locations on a conductive touch surface by sensing changes in capacitance between the conductive touch surface and a plurality of sense electrodes, wherein the sensing of the changes in capacitance includes detecting capacitance changes responsive to contact between the object and the conductive touch surface and changes in distance between the conductive touch surface and the sense electrodes, wherein the conductive touch surface overlies both of a first nonconductive region and a second nonconductive region that is less compressible than the first nonconductive region so that a portion of the conductive touch surface overlying the first nonconductive regions is capable of being displaced in response to the contact; and
in a second mode, detecting a proximity of the object to the conductive touch surface by sensing changes in capacitance of the conductive touch surface, wherein the proximity of the object to the conductive touch surface does not include contact between the object and the conductive touch surface.

16. The method of claim 15, further including connecting the touch surface to a ground node in the first mode and to a capacitance sense circuit in the second mode.

17. The method of claim 15, further including switching to the first mode from the second mode in response to detecting the proximity of the object to the touch surface in the second mode.

18. The method of claim 15, wherein detecting touches includes detecting touches that compress first regions formed between each sense electrode and the touch surface, the first regions being formed adjacent to second regions that are less compressible than the first regions.

* * * * *